United States Patent Office 3,279,919

Patented Oct. 18, 1966

3,279,919

PHOTOPOLYMERIZATION OF ETHYLENICALLY UNSATURATED ORGANIC COMPOSITIONS

Urbain Leopold Laridon, Wilrijk-Antwerp, and André Jan Conix, Antwerp, Belgium, assignors to Gevaert Photo-Producten N.V., Antwerp, Belgium, a Belgian company No Drawing. Filed Apr. 22, 1963, Ser. No. 274,853
18 Claims. (Cl. 96—35.1)

The present invention relates to the photopolymerization of ethylenically unsaturated organic compositions and to polymers obtained therefrom.

The photopolymerization of ethylenically unsaturated organic compositions can be initiated by exposure to high intensity radiation such as ultraviolet rays. Methylacrylate, for instance, on long standing in sun light is transformed into a transparent mass (cf. Ellis: The Chemistry of Synthetic Resins, vol. II (1935) page 1072). Polymerization, however, by the use of light alone, proceeds at a very much slower rate when compared to polymerization brought about by a radical generating catalyst or by heat. Moreover, the use of light alone, unaided by other agents, requires very long exposure times in order to polymerize the monomer sufficiently. Furthermore, the low rate of polymerization necessitates the use of extremely intense radiations such as those obtained from high intensity carbon arcs.

A lot of photopolymerization initiators which, under the influence of actinic light, increase the photopolymerization rate, have already been described. A survey of such photopolymerization initiators has been given by G. Delzenne in "Industrie Chimique Belge, 24 (1959) 739–764."

An object of the present invention is to provide a new class of photopolymerization initiators activatable by actinic light.

Another object of the present invention is to provide a new class of photopolymerization initiators which require very low rates of exposition to actinic light.

A further object is to provide a process whereby the photopolymerization of ethylenically unsaturated organic compositions can be carried out at a practicable rate by visible light as well as by ultraviolet light.

Other objects will appear hereinafter.

According to the present invention the photopolymerization of ethylenically unsaturated organic compositions is improved by exposing said ethylenically unsaturated organic compositions to actinic light rays in the presence of the photopolymerization initiator selected from the group consisting of aliphatic, cycloaliphatic and heterocyclic ketone hydrazones.

The quantity of aliphatic, cycloaliphatic or heterocyclic ketone hydrazones to be used as photopolymerization initiator will of course be dependent upon many variables including the particular ketone hydrazone, the wave length of light employed, the irradiation time, the monomer or monomers present, the temperature, the quantity and type of solvents present, etc.

Usually the amount of ketone hydrazone photopolymerization initiator is very small, within the range of 0.01 to 5% by weight based upon the amount of monomeric material initially present. It is seldom necessary to empoly more than 0.2 to 2% by weight to obtain a good polymerization rate.

The ethylenically unsaturated organic compositions may be exposed to actinic light from any source and of any type. The light source should, preferably although not necessarily, furnish an effective amount of ultraviolet radiation. Suitable sources of light include carbon arcs, mercury-vapor lamps, fluorescent lamps, argon glow lamps, photographic flood lamps and tungsten lamps.

Moreover, with the ketone hydrazones of the invention, ordinary day light may also be used.

For initiating the photopolymerization by means of the photopolymerization initiators according to the invention a very strong light source is not needed. Indeed, in most of the examples described hereinafter an 80 watt Philips mercury-vapor lamp, placed at a distance of about 15 cm. from the surface to be polymerized, is used. Brighter light sources are generally not needed since at these relatively low light intensities the photo-initiating influence of the ketone hydrazones according to the invention is found to be strong enough.

The photopolymerization can be carried out by any of the well-known processes, such as bulk, emulsion, suspension and solution polymerization processes. In all of these processes, the addition of a ketone hydrazone according to the invention to polymerizable materials subjected to the action of actinic light greatly increases the rate of photopolymerization.

A suitable base or support may be coated with a solution of the ethylenically unsaturated organic composition in a suitable solvent, this solution containing dissolved or homogeneously dispersed therein, a photopolymerization initiating ketone hydrazone, whereupon the solvent or solvent mixture is eliminated by known means such as evaporation, leaving a more or less thin coating of the ethylenically unsaturated organic composition upon the base or support. Thereafter the dried photopolymerizable coating is exposed to actinic light rays.

When polymerizing in solution the choice of the solvent may have a definite influence on the polymerization rate and yield. For instance when polymerizing acrylamide using dibenzylketone phenylhydrazone as a photopolymerization initiator, it is found that much higher yields of polymer are obtained when using a chlorinated hydrocarbon, as compared to other common solvents such as methanol, acetone, and the like.

When exposing the photopolymerizable composition to actinic light rays the polymerization does not start immediately. It is only after a short period, which among others depends on the ethylenically unsaturated organic composition, the photopolymerization initiator and the light intensity used, that the photopolymerization starts. The period necessary for obtaining a perceptible polymer is a measure for the efficiency of the photopolymerization initiator. In the further description and examples said period is referred to as the "inhibition period."

In some circumstances it may be desirable that the photopolymerizable composition comprises a hydrophilic or hydrophobic colloid as carrier or binding agent for the ethylenically unsaturated organic composition and the photopolymerization initiating ketone hydrazone compound. By the presence of this binding agent the properties of the light-sensitive layer are of course highly affected. The choice of the binding agent is dependent on its solubility in solvents which can also be used as solvents for the ethylenically unsaturated organic compounds and for the ketone hydrazone of the invention. Suitable binding agents are for instance poly(styrene), poly(methylmethacrylate), poly(vinylacetate), poly(vinylbutyral), partially saponified cellulose acetate and other polymers soluble in organic solvents. In some instances water-soluble polymers can be used such as gelatine, casein, starch, carboxymethyl cellulose, poly(vinylalcohol) and others. It is evident that the ratio photopolymerizable composition/binding agent also influences the photoplymerization. The larger this ratio, the higher the photo-polymerization rate generally will be for one and the same ethylenically unsaturated organic composition.

If the photopolymerizable composition is water-soluble, water may be used as solvent in coating the support. On the contrary, if water-insoluble photopolymerizable compositions are used, organic solvents, mixtures of organic solvents or mixtures of organic solvents and water may be used.

When the photopolymerizable compounds are crystallizable it is found that the photopolymerization is surprisingly more effective when the photopolymerizable compounds present in the coated layer are in the crystalline state.

By aliphatic, cycloaliphatic and heterocyclic ketone hydrazones according to the invention are meant ketone hydrazones derived from the reaction of aliphatic, aromatic, cycloaliphatic and heterocyclic mono- and polyhydrazines with aliphatic, cycloaliphatic or heterocyclic mono- and polyketones.

Aliphatic, cycloaliphatic and heterocyclic ketone hydrazones suited for being applied as photopolymerization initiators are for instance:

acetone hydrazone
acetone phenyl hydrazone
acetone p-tolylhydrazone
acetone naphthyl hydrazone
cyclohexanone phenyl hydrazone
cyclohexanone p-tolyl hydrazone
cyclohexanone methyl hydrazone
cyclohexanone benzyl hydrazone
cyclohexanone naphthyl hydrazone
dibenzyl ketone phenyl hydrazone
dibenzyl ketone p-tolyl hydrazone
dibenzyl ketone benzyl hydrazone
dibenzyl ketone naphthyl hydrazone
methyl benzyl ketone phenyl hydrazone
methyl benzyl ketone p-tolylhydrazone
fructose phenyl hydrazone
levulinic acid p-tolyl hydrazone
sodium salt of levulinic acid p-tolyl hydrazone
sodium salt of acetone phenyl hydrazone-p-sulfonic acid
sodium salt of cyclohexanone phenyl hydrazone-p-sulfonic acid.

In addition to the above non-limiting list of compounds there still exist whole series of ketone hydrazones suitable for being used as photopolymerization initiators provided they satisfy the definitions given in the objects of invention.

Suitable are aliphatic, cycloaliphatic and heterocyclic ketone hydrazones of the following general formula:

$$\begin{matrix} R_1-(CH_2)_n \\ \qquad\qquad \diagdown \\ \qquad\qquad\qquad C{=}N{-}NH{-}R_3 \\ \qquad\qquad \diagup \\ R_2-(CH_2)_m \end{matrix}$$

wherein each of $R_1$, $R_2$ and $R_3$ represents any organic aliphatic, aromatic, cycloaliphatic or heterocyclic radical which is not reactive with a hydrazone function; and wherein each of $n$ and $m$ is a positive integer at least equal to 1.

Especially suitable ketone hydrazones are those corresponding to the above formula wherein each of $R_1$ and $R_2$ is a member of the group consisting of hydrogen, alkyl, aryl, aralkyl, alkaryl, alkoxy, aryloxy, —COOH and derivatives, —$SO_3H$ and derivatives and halogen whereby $R_1$ and $R_2$ may also be linked, and thus together form part of a cycloaliphatic or heterocyclic radical; and wherein $R_3$ is a member of the group consisting of hydrogen, alkyl, aryl, alaryl, aralkyl and alkyl, aryl alkaryl and aralkyl which are substituted by at least one of the radicals taken from —COOH and derivatives, —$SO_3H$ and derivatives, halogen and alkoxy.

In addition to the monohydrazones described above, bis (ketone hydrazone) compounds may also be used as photopolymerization initiator, such as:

4,4′-bis(acetone hydrazone)-biphenyl
4,4′-bis(cyclohexanone hydrazone)-biphenyl
4,4′-bis(dibenzyl ketone hydrazone)-biphenyl
4,4′-bis(levulinic acid hydrazone)-biphenyl
1,4-bis(acetone hydrazone)-benzene.

Polymeric ketone hydrazones can also be applied. These polymeric ketone hydrazones can be obtained by reaction of a polymeric ketone and hydrazone or by reaction of a polymer containing hydrazine groups and aliphatic, cycloaliphatic or heterocyclic ketones. A hydrazine, for instance, can be allowed to react upon poly(vinyl methyl ketone). The same reaction can be carried out upon natural polymers or derivatives such as for instance upon cellulose acetoacetate.

Another series of ketone hydrazones is composed of complexes formed by the reaction of ketone hydrazones with inorganic complexing compounds such as hydrogen hexachlorostannate ($H_2SnCl_6$) and hydrogen hexachloroplatinate ($H_2PtCl_6$). These complexes are stable, crystallizable and water-soluble compounds in contradiction to the not-complexed ketone hydrazones which are mostly water-insoluble.

It was rather surprising to find that these aliphatic, cycloaliphatic and heterocyclic ketone hydrazones are such good photopolymerization initiators for all kinds of polymerizable compounds. Indeed, with aldehyde hydrazones and with aromatic ketone hydrazones no results or very unsatisfactory results are obtained. For instance, when using the following aldehyde hydrazones or aromatic ketone hydrazones the inhibition period lasts more than 4 h., in most cases even more than 8 hours:

| | Inhibition period |
|---|---|
| Anthraquinone phenyl hydrazone | more than 8 h. |
| α- and β-benzoin phenyl hydrazone | more than 8 h. |
| Benzophenone phenyl hydrazone | more than 8 h. |
| Benzil-bis-phenyl hydrazone | more than 8 h. |
| Benzaldehyde α-naphthyl hydrazone | more than 6 h. |
| Benzaldehyde β-naphthyl hydrazone | more than 6 h. |
| Cinnamaldehyde phenyl hydrazone | more than 5 h. |
| Anisaldehyde phenyl hydrazone | more than 6 h. |
| p-Methyl acetophenone hydrazone | more than 4 h. |

Hydrazones obtained from asymmetric disubstituted hydrazines give also poor results. When using the following hydrazones as photopolymerization initiators, the inhibition period lasts more than 6 hours:

Cyclohexanone as-dimethyl hydrazone
Benzaldehyde as-dimethyl hydrazone
Benzaldehyde as-diphenyl hydrazone
Dibenzyl ketone as-diphenyl hydrazone
Cyclohexanone as-diphenyl hydrazone.

Hydrazones in which a nitrogen atom or the hydrazone carbon atom is directly linked to the sulfonyl or carbonyl radical also give no results as photopolymerization initiators. When using the following hydrazones the inhibition period is from more than about 4 to 6 hours:

| | Inhibition period |
|---|---|
| Acetone(p-toluene sulfonyl) hydrazone | more than 6 hours |
| Benzaldehyde(p-toluene sulfonyl) hydrazone | more than 6 hours |
| Cyclohexanone benzoyl hydrazone | more than 6 hours |
| acetone benzoyl hydrazone | more than 6 hours |
| Benzaldehyde benzoyl hydrazone | more than 6 hours |
| Diacetyl mono(phenyl hydrazone) | more than 4 hours |
| Diacetyl bis(phenyl hydrazone) | more than 4 hours |

Hydrazones obtained from ketones having carbon-to-carbon unsaturation in their structures, and wherein this carbon-to-carbon double bond forms a conjugated system with the double bond between C and N of the hydrazones are also unsatisfactory. An example is benzalacetone phenyl hydrazone showing an inhibition period of more than 5 hours.

The ketone hydrazones can be directly mixed with the photopolymerizable composition. However, they may also be formed in situ in the photopolymerizable composition by the simultaneous presence of hydrazines and aliphatic, cycloaliphatic or heterocyclic ketones.

It is evident that also combinations of two or more ketone hydrazones may be applied as photopolymerization initiator in the photopolymerization of particular monomers.

The photosensitizing action of the ketone hydrazones can still be intensified by the presence of known sensitizing dyes of the type of the triaryl carbenium salts showing ring closure by oxygen, such as Rose Bengale and Eosine; of the type of the diaryl azenium salts showing ring closure by nitrogen such as Safranin; and of the type of the diaryl carbenium salts showing ring closure by nitrogen such as Acridin Orange.

The process of the invention may be applied to the photopolymerization of ethylenically unsaturated organic compositions. These compositions may comprise one or more ethylenically unsaturated polymerizable compounds such as acrylamide, methacrylamide, N-methylol-acrylamide, acrylonitrile, acrylic acid, methacrylic acid, calcium acrylate, vinyl carbazole, vinyl phthalimide, etc. When two of these monomers are used in the same photopolymerizable composition or if they are mixed with other polymerizable compounds, copolymers are formed during the photopolymerization. It is further suspected that in the case where the photopolymerizable material is used together with a polymeric binding agent, graft copolymers are formed between the polymeric binder and the photopolymerized material.

The ethylenically unsaturated organic composition may also comprise or consist of unsaturated compounds having more than one carbon-to-carbon double bond, e.g. two terminal vinyl groups, or of a polymeric compound containing ethylenically unsaturation. During polymerization of these compositions usually crosslinking by means of the plurally unsaturated compound will occur. Examples of compounds containing more than one carbon-to-carbon double bond are for instance divinyl benzene, diglycol diacrylates and N,N'-alkylene-bis-acrylamides. Examples of polymeric compounds containing ethylenically unsaturation are for instance allyl esters of polyacrylic acid, maleic esters of polyvinyl alcohol, polyhydrocarbons still containing carbon-to-carbon double bonds, unsaturated polyesters, cellulose acetomaleates, allylcellulose, and the like.

In the photopolymerization of ethylenically unsaturated compounds with aliphatic, cycloaliphatic or heterocyclic ketone hydrazones, high temperatures are not needed. The exposure, however, to strong light sources at a relatively short distance, brings about a certain heating of the mass to be polymerized, which heating exercises a favorable influence upon the polymerization rate. Indeed, the ketone hydrazones of the invention proved also to be very effective polymerization initiators at higher temperatures, even in the absence of light.

The photopolymerizable compositions which contain aliphatic, cycloaliphatic or heterocyclic ketone hydrazones are useful in the preparation of photographic images.

These photographic polymeric images are manufactured by exposing a photopolymerizable layer to actinic light through a process transparency, e.g. a process positive or negative (consisting of solely of opaque and transparent areas and where the opaque areas are of the same optical density, the so-called line or halftone negative or positive). After complete polymerization in the exposed areas whereby the polymeric layer is rendered insoluble in the solvent or solvents used for applying the photopolymerizable layer, the non-exposed areas are washed off with a solvent for the monomeric material.

Usually a polymerization inhibitor is added to the composition of the photopolymerizable layer in order to prevent thermal polymerization, and to make the materials capable of being stocked for a longer time. All known radical inhibitors may be used for this purpose, for example 2,6-di-tert. butyl-p-cresol.

The photopolymerizable composition is usually coated onto a support such as paper, cellulose triacetate films, poly(ethylene terephthalate) films, aluminum foils and the like. When this support material carrying the photopolymerizable composition is light-reflecting, there may be present, e.g. superposed on said support and adherent thereto or in the surface thereof, a layer or stratum absorptive of actinic light such as to minimize reflectance from the combined support of incident actinic light. The photographic polymeric images made in accordance with this invention can be used in all classes of printing, but are particularly useful in those wherein a distinct difference of height between printing and non-printing areas is required. The photopolymerizable compositions are also use in the preparation of photoresists for etching, gravure, etc.; they can be used for the manufacture of planographic printing plates such as for offset printing methods, as matrices for printing matter, and as screens for "silk screen" printing such as stencils. The compositions can be coated onto printing cylinders, e.g. plastic or metal cylinders.

The photopolymerizable layer may vary from liquid to solid composition, it may even be in gel form.

The solvent liquid used for washing or "developing" the printing plates made from photopolymerizable compositions must be selected with care, since it should have good solvent action on the unexposed monomeric material, yet have little action on the hardened image or upon the base material, the non-halation layer, or the anchor layer with with the photopolymerizable composition may be anchored to the support.

The photopolymerizable compositions are suitable for other purposes in addition to the printing uses described above, e.g. as ornamental plaques or for producing ornamental effects; as patterns for automatic engraving machines, foundry molds, cutting and stamping dies, name stamps; relief maps for braille; as rapid cure coatings, e.g. on film base; as variable area and variable density sound tracks on film; for embossing plates, paper, e.g. with a die prepared from the photopolymerizable compositions; in the preparation of printed circuits; and in the preparation of other plastic articles.

The photopolymerization initiators of the invention can be used as an ultraviolet curing catalyst for systems where low heat is a requirement in the curing of a particular part, and sunlight or other source of ultraviolet light are readily available. Unsaturated polyester coated bridge or other surfaces, roofs and other outdoor coating applications are areas where the ketone hydrazones of the invention can be advantageously employed.

The following examples illustrate the present invention.

*Example 1*

In a pyrex test tube, 1 g. of acrylamide is dissolved in the dark in a mixture of 9 ccs. of methanol and 1 cc. of acetone. Then 50 mg. of phenyl hydrazine are added. Due to the simultaneous presence of acetone and phenyl hydrazine, acetone phenyl hydrazone is formed in situ. The solution is exposed to a 300 watt lamp placed at a distance of 5 cm. After an inhibition period of about 3 min. the formation of a polymer, which precipitates, is observed. After 30 min. 52% of the acrylamide present is polymerized to poly(acrylamide).

*Example 2*

In the dark, a solution containing the following substances is prepared in a test tube:

| | |
|---|---|
| Acrylamide, g. | 3 |
| Sodium acetate·$3H_2O$, mg. | 23 |
| Phenyl hydrazinep-p-sulfonic acid, mg. | 46 |
| Water, ccs. | 8 |
| Acetone, ccs. | 2 |

The solution is illuminated by an 80 watt Philips mercury-vapor lamp placed at a distance of 15 cm. After 15 min. the solution becomes viscous due to the formation of poly(acrylamide).

*Example 3*

In the dark, a solution containing the following substances is prepared in a test tube:

| | |
|---|---|
| Acrylamide, g. | 3 |
| Sodium acetate·$3H_2O$, mg. | 28 |
| Phenyl hydrazine-p-sulfonic acid, mg. | 38 |
| Water | 9.5 |
| Cyclohexanone, cc. | 0.5 |

The solution is exposed to the light of an 80 watt Philips mercury-vapor lamp placed at a distance of 15 cm. Already after 10 min. the solution has become very viscous, due to the formation of poly(acrylamide).

*Examples 4–6*

The method of Example 1 is repeated using other monomers. In some cases the solvent which is a mixture of methanol and acetone (9:1) is replaced by 10 ccs. of acetone. The following results are obtained:

| Ex. | Monomer | Solvent | Inhibition period, min. | Yield |
|---|---|---|---|---|
| 4 | Triethylene glycol diacrylate. | Methanol/acetone (9:1) | 90 | The solution gels. |
| 5 | Vinyl carbazole | Acetone | 10 | About 10% after 1 h. |
| 6 | Vinyl phthalimide | do | 5 | About 25% after 1 h. |

*Example 7*

In the dark 1 g. of acrylamide is dissolved in a Pyrex test tube in 10 ccs. of methanol whereupon 18.8 mg. ($1.10^{-4}$ mol) of cyclohexanone phenylhydrazone are added. The solution is exposed to an 80 watt Philips mercury-vapor lamp placed at a distance of 15 cm. After an inhibition period of 4 min., poly(acrylamide) begins to precipitate.

*Examples 8–16*

The method of Example 7 is repeated using $1\times10^{-4}$ mol of other hydrazones. The results of these photopolymerizations are listed in the following table:

| Ex. | Hydrazone compound | Amount added in mg. | Inhibition period, min. |
|---|---|---|---|
| 8 | Dibenzyl ketone phenyl hydrazone | 30 | 4 |
| 9 | Methyl benzyl ketone phenylhydrazone | 22.4 | 4 |
| 10 | Fructose phenylhydrazone | 37.8 | 20 |
| 11 | Acetone p-tolyl hydrazone | 16.2 | 1 |
| 12 | Cyclohexanone p-tolyl hydrazone | 20.2 | 1 |
| 13 | Dibenzyl ketone p-tolyl hydrazone | 31.4 | 2 |
| 14 | Methyl benzyl ketone p-tolyl hydrazone | 23.8 | 2 |
| 15 | Levulinic acid p-tolyl hydrazone | 22.0 | 2 |
| 16 | Sodium salt of levulinic acid p-tolyl hydrazone. | 24.2 | 3 |

*Examples 17–25*

The method of Example 7 is repeated using other hydrazones. The results of these photopolymerizations are listed in the following table:

| Ex. | Hydrazone compound | Amount added in mg. | Inhibition period, min. |
|---|---|---|---|
| 17 | Acetone hydrazone | 36.0 | 20 |
| 18 | Cyclohexanone methylhydrazone | 90.4 | 15 |
| 19 | Cyclohexanone benzylhydrazone | 30.3 | 5 |
| 20 | Dibenzyl ketone benzylhydrazone | 31.4 | 30 |
| 21 | Acetone α-naphthyl hydrazone | 19.8 | 12 |
| 22 | Cyclohexanone α-naphthyl hydrazone | 23.8 | 12 |
| 23 | Cyclohexanone β-naphthyl hydrazone | 23.8 | 8 |
| 24 | Dibenzyl ketone β-naphthyl hydrazone | 35.0 | 22 |
| 25 | 2,6-diphenyl-3,5-dimethyl-4-piperidone phenylhydrazone. | 36.9 | 12 |

*Examples 26 to 30*

In a Pyrex test tube 0.5 g. of acrylamide is dissolved in the dark in a solvent as defined in the following table. Then 30 mg. of dibenzylketone phenylhydrazone are added. The solution is exposed during 30 min. to a 80 watt Philips mercury-vapor lamp placed at a distance of 5 cm. The polymerization yields are given in the following table:

| Example | Solvent | Amount of solvent, cc. | Yield, percent |
|---|---|---|---|
| 26 | Methanol | 10 | 36 |
| 27 | Acetone | 10 | 40 |
| 28 | Trichloroethane | 20 | 78 |
| 29 | Methylcellosolve | 10 | 50 |
| 30 | Dimethylformamide | 10 | 25 |

*Example 31*

The method of Example 7 is repeated using as photopolymerization initiator 33 mg. of di(butanone phenyl hydrazonium) hexachlorostannate. This product is obtained according to the method described in J. Chem. Soc. (1954) p. 2429. Inhibition period: 7 min.

*Example 32*

The method of Example 7 is repeated using as photopolymerization initiator di(acetone phenyl hydrazonium) hexachlorostannate. Inhibition period: 6 min.

*Example 33*

In the dark, the following compounds are dissolved in 50 ccs. of acetone:

| | |
|---|---|
| Acrylamide, g. | 0.5 |
| Cyclohexanone phenylhydrazone, mg. | 10 |
| Poly(vinyl acetate), g. | 1 |

To this solution 5 mg. of 2,6-di-tert. butyl-p-cresol are added as inhibitor. The solution obtained is coated (still in the dark) onto a glass plate in such a way that after evaporating the acetone a layer of about 50μ thickness remains. X-ray examination shows that the acrylamide monomer is present in the layer in the crystalline form.

A process transparency as described above is laid upon the glass plate and the whole is exposed during 15 sec. to an 80 watt Philips mercury-vapor lamp placed at a distance of 5 cm. Hereafter, the non-exposed and thus non-polymerized art of the layer is washed away with acetone. A relief image is obtained. X-ray examination of the relief image does not show any trace of crystallinity in the exposed material.

*Example 34*

In the dark the following compounds are dissolved in 15 ccs. of acetone:

| | |
|---|---|
| Poly(vinyl acetate), g. | 0.5 |
| Acrylamide, g. | 1 |
| N,N'-methylene bisacrylamide, g. | 0.1 |
| Dibenzyl ketone phenyl hydrazone, mg. | 2 |

The solution obtained is coated (still in the dark) onto an aluminum foil in such a way that after drying a layer of about 10μ thickness remains. A negative process transparency is laid upon the photopolymerizable layer and the whole is exposed to an 80 watt Philips mercury-vapor lamp placed at a distance of 5 cm. The foil is developed in acetone. After an exposure-time of 15 sec. an image is formed. If in addition to the above composition 2 mg. of the sensitizing dye Rose Bengale are added a good image is already obtained after an exposure-time of 5 sec.

*Example 35*

In the dark, the following compounds are added to 15 ccs. of acetone:

| | |
|---|---|
| Copoly(vinyl acetone/N-vinyl pyrrolidone) (1/1), g. | 0.5 |
| Acrylamide, g. | 1 |
| N,N'-methylene bisacrylamide, g. | 0.1 |
| Dibenzyl ketone phenyl hydrazone, mg. | 2 |

The solution is coated, in the dark, onto an aluminum foil in such a way that after drying a layer of about 10μ thickness remains.

A process transparency is laid upon the photopolymerizable material and the whole is exposed to an 80 watt Philips mercury-vapor lamp placed at a distance of 5–10 cm. The foil is developed in acetone.

When the light source is placed at a distance of 5 cm. an exposure of 1 sec. suffices to obtain a very good image. With the light source at 10 cm. a 3 sec. exposure-time is needed.

If 2 mg. of Rose Bengale are added to the original composition a good image will be obtained already after an exposure-time of 1 sec., the lamp being placed at a distance of 10 cm.

When, moreover, 10 mg. of 2,6-di-tert. butyl-p-cresol are added to the photopolymerizable layer and the lamp is placed at a distance of 5 cm., an exposure-time of 15 sec. is needed, for obtaining a good image.

*Example 36*

A solution containing the following substances is prepared:

| | |
|---|---|
| Poly(vinyl acetate), g. | 0.5 |
| 60% aqueous solution of N-methylol acrylamide, ccs. | 2 |
| 2,6-di-tert. butyl-p-cresol, mg. | 10 |
| Dibenzyl ketone phenyl hydrazone, mg. | 50 |
| Acetone, ccs. | 15 |

This solution is coated onto an aluminum foil in such a way that after drying a layer of about 10μ thickness remains.

The photopolymerizable layer is exposed through a process transparency and developed in acetone. If exposure occurs with a U.V.-light source a good image is already obtained after an exposure-time of 1 sec., whereas when using an ordinary 300 watt lamp an exposure-time of 5 sec. is needed.

*Example 37*

The method of Example 34 is repeated using 0.5 g. of copoly(vinyl acetate/N-vinyl pyrrolidone) (1/1) instead of 0.5 g. of poly(vinyl acetate). A good image is obtained after exposing for 1 sec. to U.V.-light.

*Example 38*

A solution of 2.25 g. of gelatin in 15 ccs. of water is prepared whereupon the following substances are added in the dark:

| | |
|---|---|
| Acrylamide, g. | 0.9 |
| N,N'-methylene bisacrylamide, g. | 0.1 |
| Water, ccs. | 0.6 |
| Levulinic acid p-tolyl hydrazone, mg. | 220 |
| N sodium hydroxide, cc. | 1 |

This solution is coated onto a cellulose triacetate film provided with a known subbing layer in such a way that after drying a 20μ thick layer remains. A process transparency is laid upon said layer and the whole is exposed to an 80 watt Philips mercury-vapor lamp placed at a distance of 5 cm. Thereupon, development takes place with tepid water. Already after an exposure-time of 3 min. 30 sec. a good relief image is obtained.

*Example 39*

A solution of 2.25 g. of gelatin in 10 ccs. of water is prepared whereupon the following substances are added in the dark:

| | |
|---|---|
| Acrylamide, g. | 0.45 |
| N,N'-methylene bisacrylamide, g. | 0.22 |
| Water, ccs. | 5 |
| Levulinic acid p-tolylhydrazone, g. | 0.22 |
| N solution hydroxide, cc. | 1 |

The solution is coated onto a cellulose triacetate film provided with a subbing layer, in such a way that after drying a layer of 10μ thickness remains. Said layer is exposed through a transparency using an 80 watt Philips mercury-vapor lamp placed at a distance of 5 cm. whereupon development takes place with tepid water.

A good relief image is obtained after an exposure-time of 2 min.

*Example 40*

A solution of 2.25 g. of gelatin in 15 ccs. of water is prepared to which the following substances are added in the dark:

| | |
|---|---|
| Acrylamide, g. | 1.8 |
| N,N'-methylene bisacrylamide, g. | 0.2 |
| Water, cc. | 1.2 |
| Acetone phenyl hydrazone p-sulfonic acid, g. | 0.228 |
| N sodium hydroxide, cc. | 1 |

The solution is coated onto a cellulose triacetate film, provided with a subbing layer, in such a way that after drying a layer of 25μ thickness remains. Said layer is exposed through a process transparency and developed with tepid water. A good relief image is obtained after an exposure-time of 8 min.

*Example 41*

The same process of Example 40 is carried out with the only difference that the 0.228 g. of acetone phenyl hydrazone p-sulfonic acid are replaced by 0.20 g. of levulinic acid phenyl hydrazone. After an exposure time of 10 seconds a good relief image is obtained.

*Examples 42–45*

In the dark a solution containing the following substances is prepared in a test tube:

| | |
|---|---|
| Methanol, ccs. | 10 |
| Acrylamide, g. | 1 |
| Ketone (see following table), cc. | 0.5 |
| Diphenyl-p,p'-dihydrazine, g. | 0.05 |

By the persence of the ketone and the hydrazine the corresponding ketone hydrazone is formed in situ.

The solution is exposed to an 80 watt Philips mercury-vapor lamp placed at a distance of 10 cm. The photopolymerization results are listed in the following table:

| Example | Ketone | Inhibition period, min. | Yield after 15 min., percent |
|---|---|---|---|
| 42 | Acetone | 8 | 10 |
| 43 | Cyclohexanone | 2 | 10 |
| 44 | Dibenzyl ketone | 2 | 16 |
| 45 | Levulinic acid | 4 | 7 |

*Example 46*

0.7 g. of poly(vinyl methyl ketone) having an intrinsic viscosity [η] of 0.2 dl./g. when measured at 25° C. in acetone, is dissolved in 5 ccs. of methylene chloride. To this solution 1 cc. of phenyl hydrazine is added. The solution is allowed to stand overnight during which it becomes turbid due to liberation of water. The product is separated in the form of yellow flocks by pouring the solution into ethanol. The product is sucked off and dried under vacuum. Yield: 1.1 g.

The poly(vinyl methyl ketone phenyl hydrazone) obtained comprises recurring units of the following formula:

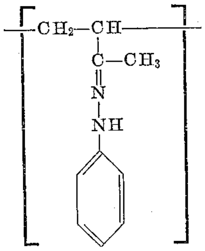

This polymer is soluble in methylene chloride, 1,1,2-trichloroethane, sym. tetrachloroethane, ether and acetone. It is insoluble in ethanol and methanol.

0.5 g. of acrylamide is dissolved in 15 ccs. of 1,1,2-trichloroethane whereupon 0.016 g. of poly(vinyl methyl ketone phenyl hydrazone) is added. The solution is exposed to an 80 watt Philips mercury-vapor lamp placed at a distance of 15 cm. Inhibition period: 3 min.

When 0.1 g. of poly(vinyl methyl ketone phenyl hydrazone) is added the inhibition period is 1 min.

*Example 47*

In a 100 ccs. flask fitted with a reflux condenser the following substances are dissolved:

| | |
|---|---|
| Acetone, ccs. | 20 |
| Phenyl hydrazine, g. | 0.1 |
| Acrylamide, g. | 2 |

This solution is allowed to reflux in the dark. After 15 min. polymer begins to precipitate. When refluxing is continued for 5 h. a polymer yield of 42% is obtained.

*Example 48*

In a 100 ccs. flask fitted with a reflux condenser the following substances are dissolved:

| | |
|---|---|
| Cyclohexanone, ccs. | 20 |
| Phenyl hydrazine, g. | 0.1 |
| Acrylamide, g. | 2 |

The solution obtained is allowed to reflux in the dark. After 15 min. polymer begins to precipitate and when refluxing is continued for 2 h. a yield of 86% is obtained.

We claim:

1. A process for the photopolymerization of ethylenically unsaturated organic compositions which comprise exposing said ethylenically unsaturated organic compositions to actinic light rays in the presence of a photopolymerization initiator having the formula:

$$\begin{array}{l} R_1-(CH_2)_n \\ \qquad\qquad \diagdown \\ \qquad\qquad\quad C=N-NH-R_3 \\ \qquad\qquad \diagup \\ R_2-(CH_2)_m \end{array}$$

wherein each of $R_1$, $R_2$ and $R_3$ is selected from the group consisting of aliphatic, aromatic, cycloaliphatic and heterocyclic radicals, said radicals being non-reactive with a hydrazone function, and wherein each of $n$ and $m$ is a positive integer at least equal to 1.

2. A process for the photopolymerization of ethylenically unsaturated organic compositions which comprise exposing said ethylenically unsaturated organic compositions to actinic light rays in the presence of a photopolymerization initiator having the formula:

$$\begin{array}{l} R_1-(CH_2)_n \\ \qquad\qquad \diagdown \\ \qquad\qquad\quad C=N-NH-R_3 \\ \qquad\qquad \diagup \\ R_2-(CH_2)_m \end{array}$$

wherein each of $R_1$ and $R_2$ is selected from the group consisting of hydrogen, alkyl, aryl, aralkyl, alkaryl, alkoxy, aryloxy, —COOH and derivatives, —$SO_3H$ and derivatives and halogen; and wherein $R_1$ and $R_2$ may also be linked and form together part of a radical selected from cycloaliphatic and heterocyclic radicals; $R_3$ is selected from the group consisting of hydrogen, alkyl, aryl, alkaryl, aralkyl and alkyl, aryl, alkaryl and aralkyl which are substituted by at least one of the radicals selected from —COOH and derivatives, —$SO_3H$ and derivatives, halogen and alkoxy, and wherein each of $n$ and $m$ is a positive integer at least equal to 1.

3. A process as set forth in claim 1, wherein the ethylenically unsaturated organic composition comprise at least one ethylenically unsaturated polymerizable compound mixed with a polymeric binding agent.

4. A process as set forth in claim 1, wherein the ethylenically unsaturated composition comprises at least one unsaturated compound having more than one carbon-to-carbon double bond.

5. A process as set forth in claim 1, wherein the ethylenically unsaturated composition comprises a polymeric compound containing ethylenically unsaturation.

6. A process as set forth in claim 1, wherein the photopolymerization initiator is used in an amount between 0.01 and 5% by weight based upon the amount of photopolymerizable material present.

7. A process as set forth in claim 1, wherein the ethylenically unsaturated composition is polymerized in solution.

8. A process as set forth in claim 1, wherein the ethylenically unsaturated composition is applied as a coating on a support.

9. A process as set forth in claim 1, wherein the ethylenically unsaturated composition is present in the crystalline state.

10. A process as set forth in claim 1, wherein the photosensitizing action of the ketone hydrazones is intensified by the presence of sensitizing dyes.

11. A process for producing a polymeric photographic image, which comprises exposing to actinic light rays through a process transparency a photographic element comprising a support having thereon a light-sensitive layer comprising an ethylenically unsaturated organic composition and as photopolymerization initiator at least one compound having the formula:

$$\begin{array}{l} R_1-(CH_2)_n \\ \qquad\qquad \diagdown \\ \qquad\qquad\quad C=N-NH-R_3 \\ \qquad\qquad \diagup \\ R_2-(CH_2)_m \end{array}$$

wherein each of $R_1$, $R_2$, and $R_3$ is selected from the group consisting of aliphatic, aromatic, cycloaliphatic and heterocyclic radicals, said radicals being non-reactive with a hydrazone function, and wherein each of $n$ and $m$ is a positive integer at least equal to 1, whereby in the exposed areas said ethylenically unsaturated organic composition is polymerized to an insoluble state, and removing the layer in the non-exposed areas.

12. A photopolymerizable element comprising a support and superposed thereon a light-sensitive layer comprising an ethylenically unsaturated organic composition and as photopolymerization initiator at least one compound having the formula:

$$\begin{array}{l} R_1-(CH_2)_n \\ \qquad\qquad \diagdown \\ \qquad\qquad\quad C=N-NH-R_3 \\ \qquad\qquad \diagup \\ R_2-(CH_2)_m \end{array}$$

wherein each of $R_1$, $R_2$, and $R_3$ is selected from the group consisting of aliphatic, aromatic, cycloaliphatic and heterocyclic radicals, said radicals being non-reactive with a hydrazone function, and wherein each of $n$ and $m$ is a positive integer at least equal to 1.

13. A photopolymerizable element as set forth in claim 12, wherein the support is selected from paper, cellulose triacetate films, poly(ethylene terephthalate) films and aluminum foils.

14. A photopolymerizable element as set forth in claim 12, wherein the support carries a layer capable of absorbing actinic light intermediate between said support and said light-sensitive layer.

15. A process for the photopolymerization of ethylenically unsaturated organic compositions which comprises exposing said ethylenically unsaturated organic compositions to actinic light rays in the presence of a photopolymerization initiator selected from the group consisting of an aliphatic bis(ketone hydrazone), a cycloaliphatic bis(ketone hydrazone), and a heterocyclic bis(ketone hydrazone).

16. A process for the photopolymerization of ethylenically unsaturated organic compositions which comprises exposing said ethylenically unsaturated organic compositions to actinic light rays in the presence of a photopolymerization initiator selected from the group consisting of aliphatic, cycloaliphatic, and heterocyclic polymeric ketone hydrazones, said hydrazones being obtained by reaction of a polymeric ketone and a hydrazine.

17. A process as set forth in claim 1 wherein the photopolymerization initiator is a complex formed by reaction of ketone hydrazones with inorganic complexing agents.

18. A process for the photopolymerization of ethylenically unsaturated organic compositions which comprises exposing said ethylenically unsaturated organic compositions to actinic light rays in the presence of a photopolymerization initiator selected from the group consisting of aliphatic, cycloaliphatic, and heterocyclic polymeric ketone hydrazones, said hydrazones being obtained by reaction of a polymer containing hydrazine groups with a compound selected from aliphatic, cycloaliphatic, and heterocyclic ketones.

References Cited by the Examiner

UNITED STATES PATENTS

| | | | |
|---|---|---|---|
| 2,462,680 | 2/1949 | Sargent | 260—80 |
| 2,478,066 | 8/1949 | Peski | 260—82 X |
| 2,601,293 | 6/1952 | Howard | 260—78.4 |
| 2,791,504 | 5/1957 | Plambeck | 96—115 |
| 2,882,262 | 4/1959 | Smith et al. | 96—115 |

NORMAN G. TORCHIN, *Primary Examiner.*

ALEXANDER D. RICCI, *Examiner.*

J. HOFFMAN, R. H. SMITH, *Assistant Examiners.*